US008580068B2

(12) United States Patent
Cheng

(10) Patent No.: US 8,580,068 B2
(45) Date of Patent: Nov. 12, 2013

(54) METHOD FOR MANUFACTURING RIGID-FLEXIBLE PRINTED CIRCUIT BOARD

(75) Inventor: Chien-Pang Cheng, Tayuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 282 days.

(21) Appl. No.: 13/046,792

(22) Filed: Mar. 14, 2011

(65) Prior Publication Data

US 2011/0240215 A1    Oct. 6, 2011

(30) Foreign Application Priority Data

Apr. 1, 2010    (CN) .................... 2010 1 0137766

(51) Int. Cl.
*B32B 38/10*    (2006.01)

(52) U.S. Cl.
USPC ........... 156/249; 156/270; 156/80; 156/312; 156/311; 156/268; 156/250; 156/267

(58) Field of Classification Search
USPC ......... 156/249, 250, 270, 268, 267, 311, 312, 156/80
See application file for complete search history.

(56) References Cited

U.S. PATENT DOCUMENTS 4,033,030 A * 7/1977 Robinson et al. ........... 29/622
5,690,837 A * 11/1997 Nakaso et al. .............. 216/17
2002/0092163 A1 * 7/2002 Fraivillig .................... 29/847
2006/0169485 A1 * 8/2006 Kawaguchi et al. ......... 174/254
2006/0266475 A1 * 11/2006 Kumar et al. ............... 156/312

FOREIGN PATENT DOCUMENTS

TW          297933           2/1997
TW          510155          11/2002
TW      200840449 A         10/2008

* cited by examiner

*Primary Examiner* — Daniel McNally
*Assistant Examiner* — Margaret Squalls
(74) *Attorney, Agent, or Firm* — Altis & Wispro Law Group, Inc.

(57) ABSTRACT

A method for manufacturing a rigid-flexible printed circuit boards includes following steps. First, a first rigid substrate is attached to a first adhesive layer. Second, a first opening through the combined first rigid substrate and the first adhesive layer is defined. Third, the first rigid substrate is laminated to a flexible substrate, the flexible substrate includes an exposed portion exposed via the first opening. Fourth, a second rigid substrate is attached to a second adhesive, a glass transition temperature of the second adhesive layer being lower than that of the first adhesive layer. Fifth, a second opening through the combined first rigid substrate and the first adhesive layer is defined. Sixth, the second rigid substrate is laminated to the flexible substrate in such a manner that the flexible substrate is sandwiched between the first and second adhesive layers, the exposed portion is exposed in the first and the second openings.

18 Claims, 16 Drawing Sheets

METHOD FOR MANUFACTURING RIGID-FLEXIBLE PRINTED CIRCUIT BOARD

BACKGROUND

1. Technical Field

The present disclosure relates to manufacture of printed circuit boards, particularly to a method for manufacturing a rigid-flexible printed circuit board.

2. Description of Related Art

Rigid-flexible printed circuit boards (R-F PCBs) are widely used in electronic devices. A rigid-flexible printed circuit board has a rigid region and a flexible region. The rigid region is configured for assembling electronic components and maintaining electrical connections among the electronic components. The flexible region is connected to the rigid region and can be bent relative to the rigid region. Thus, a number of electronic components can be assembled on the rigid region of the rigid flexible printed circuit board without occupying a large amount of space.

A typical method for manufacturing a rigid-flexible printed circuit board includes the following steps. First, two rigid substrates are provided, each rigid substrate defines an opening, and is attached with an adhesive layer. Second, a flexible substrate is provided. Third, the two rigid substrates are laminated to the two opposite sides of the flexible substrate once, thus a laminated substrate is obtained. Fourth, the laminated substrate is cut along a predetermined line, and a rigid-flexible substrate is obtained. In the rigid-flexible substrate, the portion of the flexible substrate exposed from the opening forms a flexible region, and the rest portion forms a rigid portion.

However, when the two rigid substrates are laminated to the flexible substrate, pressure applied on the portion exposed from the opening and the rest of the flexible substrate are different, pleat may be produced in the flexible substrate. Thus, the appearance and quality of the rigid-flexible printed circuit board are affected.

What is needed, therefore, is a method for manufacturing the rigid-flexible printed circuit board which can overcome the above-described problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

A method for manufacturing a rigid-flexible printed circuit board according to an embodiment will now be described in detail below with reference to the drawings.

The method includes the steps in no particular order of:

(1) attaching a first rigid substrate to a first adhesive layer, the first rigid substrate comprising a first laminating portion and a first unwanted portion;

(2) removing the first unwanted portion and a portion of the first adhesive layer overlaid by the first unwanted portion, thereby defining a first opening through the combined first rigid substrate and the first adhesive layer;

(3) laminating the first rigid substrate to a flexible substrate, the flexible substrate comprising an exposed portion exposed via the first opening and a second laminating portion overlaid by the first laminating portion;

(4) attaching a second rigid substrate to a second adhesive layer, the second rigid substrate comprising a third laminating portion and a second unwanted portion, a glass transition temperature of the second adhesive layer being lower than that of the first adhesive layer;

(5) removing the second unwanted portion and a portion of the second adhesive layer overlaid by the second unwanted portion, thereby defining a second opening through the combined second rigid substrate and the second adhesive layer;

(6) laminating the second rigid substrate to the flexible substrate in such a manner that the flexible substrate is sandwiched between the first and second adhesive layers, the second laminating portion is sandwiched between the first and the third laminating portions, the exposed portion is exposed in the first and the second openings.

Figure 1:
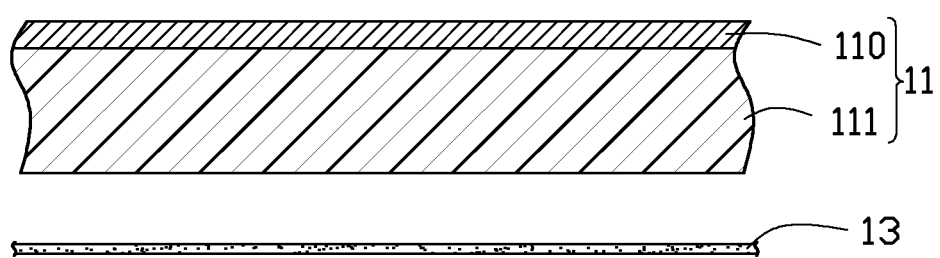
FIG. 1 is a cross-sectional view of a first rigid substrate and a separate first adhesive layer.
Figure 2:
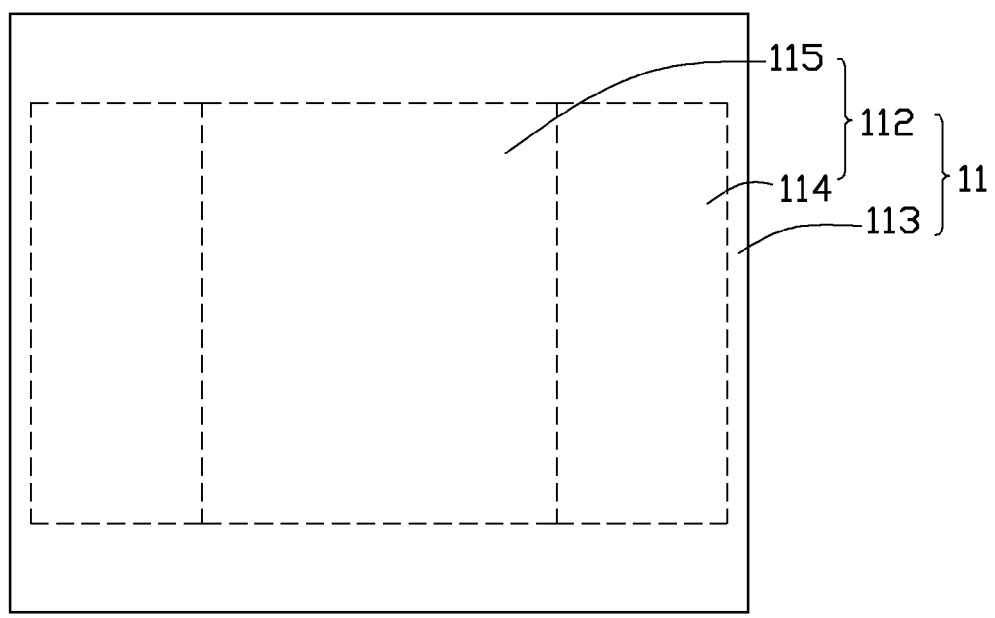
FIG. 2 is a top plan view of the first rigid substrate in FIG. 1, having a first main portion and a first peripheral margin portion connected to the first main portion, the first main portion including two first laminating portions and a first unwanted portion connected between the first laminating portions.
Figure 3:
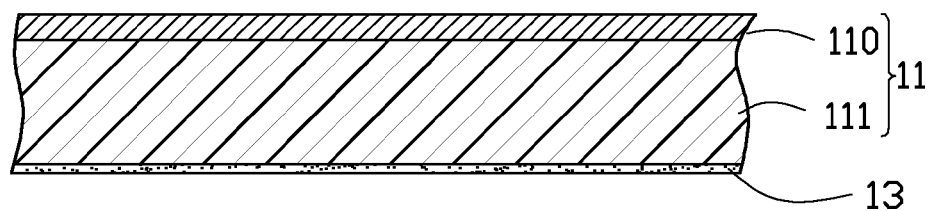
FIG. 3 is similar to FIG. 1, but showing the first adhesive layer attached to the first rigid substrate.

Referring to FIG. 1 to FIG. 3, in step (1), a first rigid substrate 11 is attached to a separate first adhesive layer 13.

The first rigid substrate 11 is a single-sided copper clad laminate (CCL), and includes a first electrically conductive layer 110 and a first insulating layer 111 laminated on the first electrically conductive layer 110. The first rigid substrate 11 defines a first main portion 112 and a first peripheral margin portion 113 connected to the first main portion 112. In the present embodiment, the first main portion 112 includes two first laminating portions 114 and a first unwanted portion 115 interconnecting the two first laminating portions 114. The first laminating portions 114 and the first unwanted portion 115 are all rectangular shaped. The first electrically conductive layer 110 is not patterned.

It is noted that the number of the first laminating portions 114 of the first rigid substrate 11 is not limit to two, less or more may be defined therein according to practical need.

The first adhesive layer 13 has a glass transition temperature (Tg) in a range from about 120 degrees Celsius ( ) to about 130. The first adhesive layer 13 is a material such as polyimide (PI), polytetrafluoroethylene (PTFE), polyamide (PA), polymethylmethacrylate (PMMA), polycarbonate (PC), polyethylene terephthalate (PET), polyamide polyethylene-terephthalate copolymer or a combination thereof.

The attachment of the first adhesive layer 13 to the first rigid substrate 11 includes the following steps. First, a number of locating holes (not shown) are formed in the first rigid substrate 11 and a corresponding portion of the first adhesive layer 13. Second, a number of pins (not shown) are provided, the first adhesive layer 13 is located on the first rigid substrate 11 by cooperation of the locating holes and pins. Third, the first adhesive layer 13 is roller compacted to the first rigid substrate 11.

Figure 4:
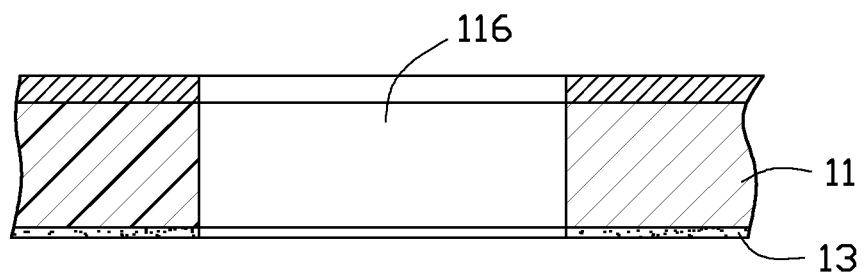
FIG. 4 is similar to FIG. 3, but showing a first opening defined by removing the first unwanted portion and a portion of the first adhesive layer corresponding to the first unwanted portion.

Referring to FIG. 4, in step (2), the first unwanted portion 115 and a portion of the first adhesive layer 13 overlaid by the first unwanted portion 115 is removed, thereby defining a first opening 116 through the combined first rigid substrate 11 and the first adhesive layer 13. The first opening 116 can be formed using a laser beam, punching, or other means.

Figure 5:
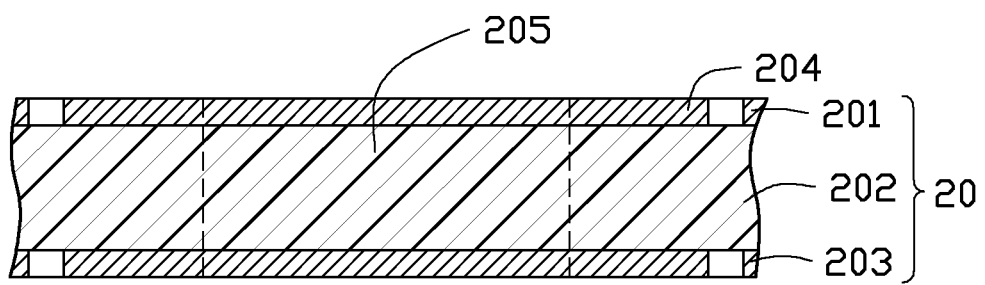
FIG. 5 is a cross-sectional view of a flexible substrate, which includes an exposed portion corresponding to the first opening and two second laminating portions each corresponding to the first laminating portion.
Figure 6:
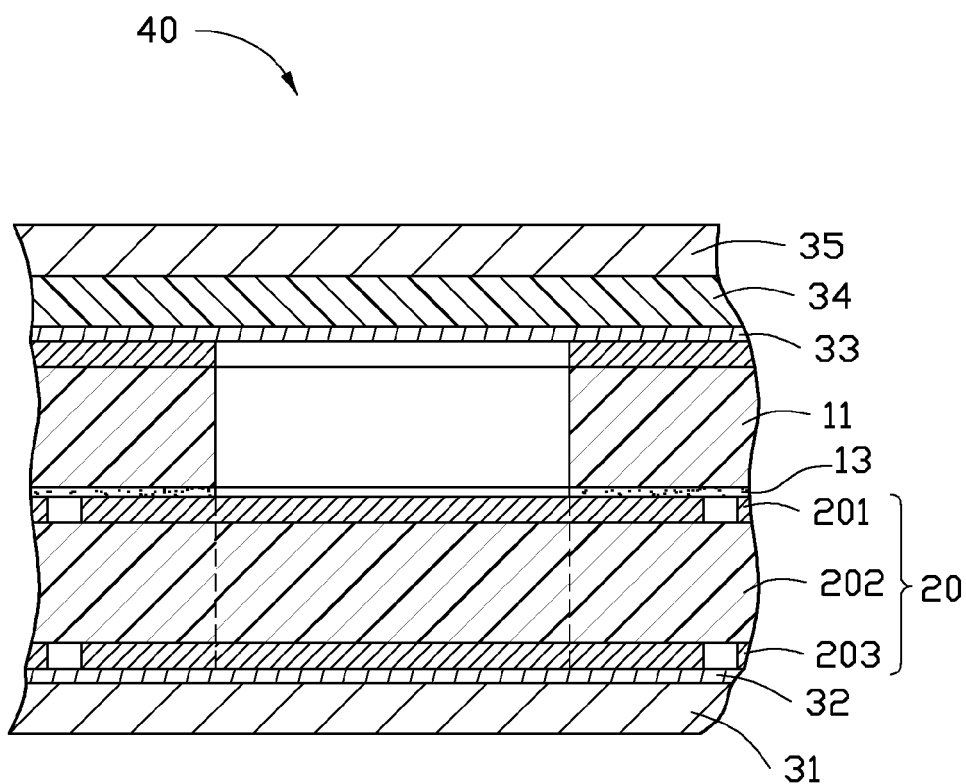
FIG. 6 is a cross-sectional view of one stacked substrate, which is obtained by stacking a first bolster plate, a first release film, the flexible substrate of FIG. 5, the first rigid substrate of FIG. 4, a second release film, a silicon rubber sheet and a second bolster plate together.
Figure 7:
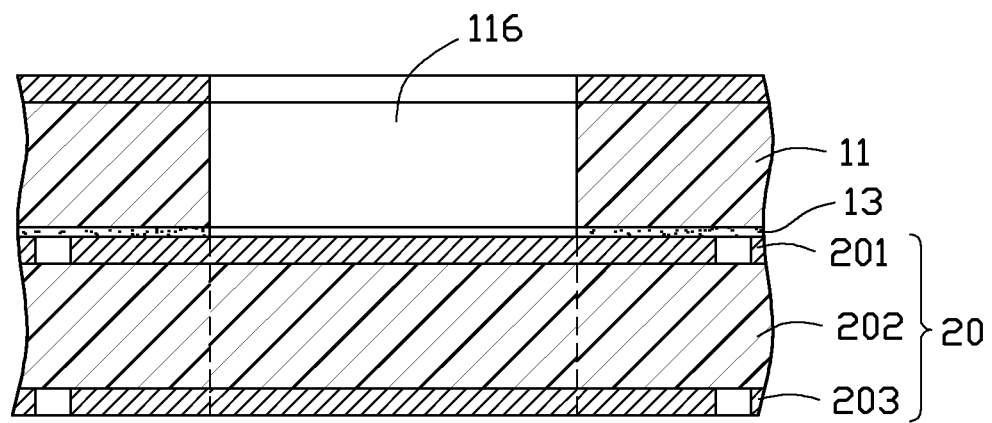
FIG. 7 is a cross-sectional view of one laminated substrate, which is obtained by laminating the first rigid substrate of FIG. 4 onto the flexible substrate of FIG. 5.

Referring to FIG. 5 to FIG. 7, in step (3), the first rigid substrate 11 is laminated to a flexible substrate 20.

The flexible substrate 20 is a double-sided flexible copper clad laminate (FCCL), and includes a second electrically conductive layer 201, a third electrically conductive layer 203 and a second insulating layer 202 positioned between the second and third electrically conductive layer 201, 203. In the present embodiment, the flexible substrate 20 includes two second laminating portions 204 and an exposed portion 205 interconnecting the two second laminating portions 204. Each of the two second laminating portions 204 corresponds to the first laminating portions 114. The exposed portion 205 corresponds to the first opening 116. The exposed portion 205 and the two second laminating portions 204 each has electrically conductive patterns, which are formed in the second and third electrically conductive layers 201 and 203. Furthermore, a number of plated through holes (not shown) can be formed in the flexible substrate 20 to electrically interconnect the second and third electrically conductive layers 201 and 203. The flexible substrate 20 defines a peripheral margin portion (not shown) around the second laminating portions 204 and the exposed portion 205. The peripheral margin portion (not shown) corresponds to the first peripheral margin portion 113.

It is noted that if the first rigid substrate 11 is a patterned double-sided copper clad laminate, the flexible substrate 20 can be a single-sided FCCL.

After laminating, the first adhesive layer 13 attached to the first rigid substrate 11 is adjacent to the second electrically conductive layer 201 of the flexible substrate 20, and the second laminating portion 204 is overlaid by the first laminating portion 114.

Laminating the first rigid substrate 11 to the flexible substrate 20 includes following steps. First, the first rigid substrate 11 is attached to the second electrically conductive layer 201 of the flexible substrate 20 using a roller compacting precess. Second, a first bolster plate 31, a second bolster plate 35, a first release film 32, a second release film 33, and a silicon rubber sheet 34 are provided. The first bolster plate 31, the first release film 32, the flexible substrate 20, the first adhesive layer 13, the first rigid substrate 11, the second release film 33, the silicon rubber sheet 34 and the second bolster plate 35 are stacked one on another in that order, thus a first stacked substrate 40 shown in FIG. 6 is obtained. Third, the first stacked substrate 40 is sent to a pressing mechanism and is compressed.

The step of compressing of the first stacked substrate 40 includes an initially-pressing stage, a main-pressing stage succeeding to the initially-pressing stage, and a cold-pressing stage succeeding to the main-pressing stage. The pressure applied on the first stacked substrate 40 in the main-pressing stage is larger than that in the initially-pressing stage, and a time period of the main-pressing stage is longer than that of the initially-pressing stage. The pressure applied on the first stacked substrate 40 in the main-pressing stage is larger than that in the cold-pressing stage, and a time period of the main-pressing stage is longer than that of the cold-pressing stage. The purpose of the initially-pressing stage is to remove the gas between the adjacent layers of the first stacked substrate 40. In the initially-pressing stage which lasts 5 minutes, the temperature of the first stacked substrate 40 is 160° C., and the pressure applied on the first stacked substrate 40 is 10 kilograms per square centimeter (kg/cm2). The first adhesive layer 13 intenerates and the material of the first adhesive layer 13 flows, thus the gas between the adjacent layers of the first stacked substrate 40 is removed. The next procedure is the main-pressing stage. The purpose of the main-pressing stage is to cure the first adhesive layer 13. In the main-pressing stage, which lasts 40 minutes, the temperature of the first stacked substrate 40 is 160° C., and the pressure applied on the first stacked substrate 40 is 30 kilograms per square centimeter (kg/cm2). The purpose of the cold-pressing stage is to prevent the first stacked substrate 40 from deformation caused by a sudden cooling. In the clod-pressing stage which lasts about 15 minutes, the first stacked substrate 40 is cooled by a coolant to 12° C., and the pressure applied on the first stacked substrate 40 is decreased to 10 kilograms per square centimeter (kg/cm2). The first bolster plate 31, the first release film 32, the second release film 33, the silicon rubber sheet 34 and the second bolster plate 35 are removed after the compressing process. After the compressing process, the first adhesive layer 13 is completely cured. Because of the support of the first and second bolster plates 31 and 35, no pleat is formed in the flexible substrate 20.

The second laminating portions 204 are adhered to the first laminating portions 114 by the first adhesive layer 13. The cured first adhesive layer 13 is in contact with the second electrically conductive layer 201 of the flexible substrate 20. The exposed portion 205 is exposed to outside through the first opening 116.

Figure 8:
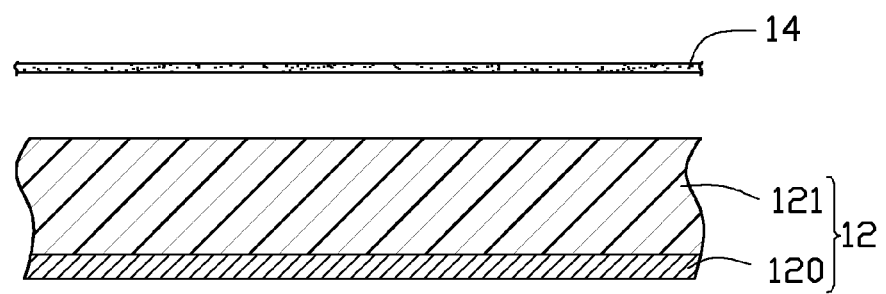
FIG. 8 is a cross-sectional view of a second rigid substrate and a separate second adhesive layer.
Figure 9:
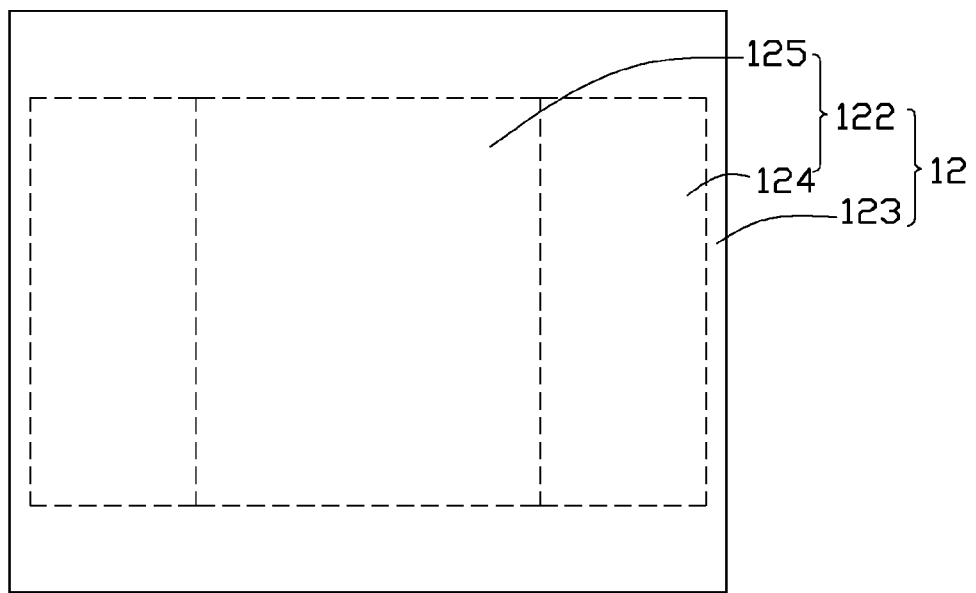
FIG. 9 is a top plan view of the second rigid substrate in FIG. 7, having a second main portion and a second peripheral margin portion connected to the second main portion, the second main portion including two third laminating portions and a second unwanted portion connected between the two third laminating portions.
Figure 10:
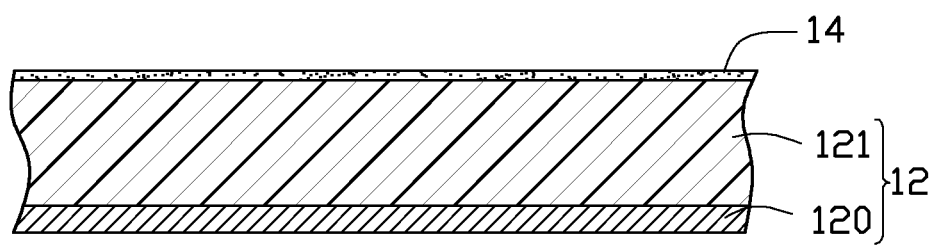
FIG. 10 is similar to FIG. 8, but showing the second adhesive layer attached to the second rigid substrate.

Referring to FIG. 8 to FIG. 10, in step (4), a second rigid substrate 12 is attached to a separate second adhesive layer 14.

The second rigid substrate 12 is a single-sided copper clad laminate (CCL), and includes a fourth electrically conductive layer 120 and a third insulating layer 121 laminated on the fourth electrically conductive layer 120. Correspondingly, the second rigid substrate 12 defines a second main portion 122 and a second peripheral margin portion 123 connected to the second main portion 122. In the present embodiment, the second main portion 122 includes two third laminating portions 124 and a second unwanted portion 125 connected between the two third laminating portions 124. The third laminating portions 124 and the second unwanted portion 125 are all rectangular shaped. The fourth electrically conductive layer 120 is not patterned.

It is noted that the number of the third laminating portions 124 of the second rigid substrate 12 is not limit to be two, less or more may be defined therein according to practical need.

The second adhesive layer 14 has a lower glass transition temperature than that of the first adhesive layer 13. The glass transition temperature difference between the first and second adhesive layers 13 and 14 is larger than 50. In the present embodiment, the second adhesive layer 14 has a glass transition temperature (Tg) in a range from about 70 degrees Celsius ( ) to about 80. The second adhesive layer 14 is a material the same as the first adhesive layer 12.

The method for attaching the second adhesive layer 14 to the second rigid substrate 12 is almost the same as the method for attaching the first adhesive layer 13 to the first rigid substrate 11.

Figure 11:
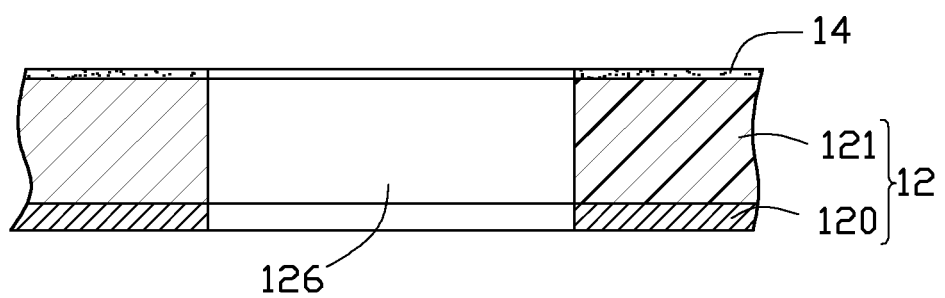
FIG. 11 is similar to FIG. 10, but showing a second opening defined by removing the second unwanted portion and a portion of the second adhesive layer corresponding to the second unwanted portion.

Referring to FIG. 11, in step (5), the second unwanted portion 125 and a portion of the second adhesive layer 14 overlaid by the second unwanted portion 125 is removed, and a second opening 126 through the combined second rigid substrate 12 and the second adhesive layer 14 is defined. The second opening 126 can be formed using a laser beam, a blanking die or other means.

Figure 12:
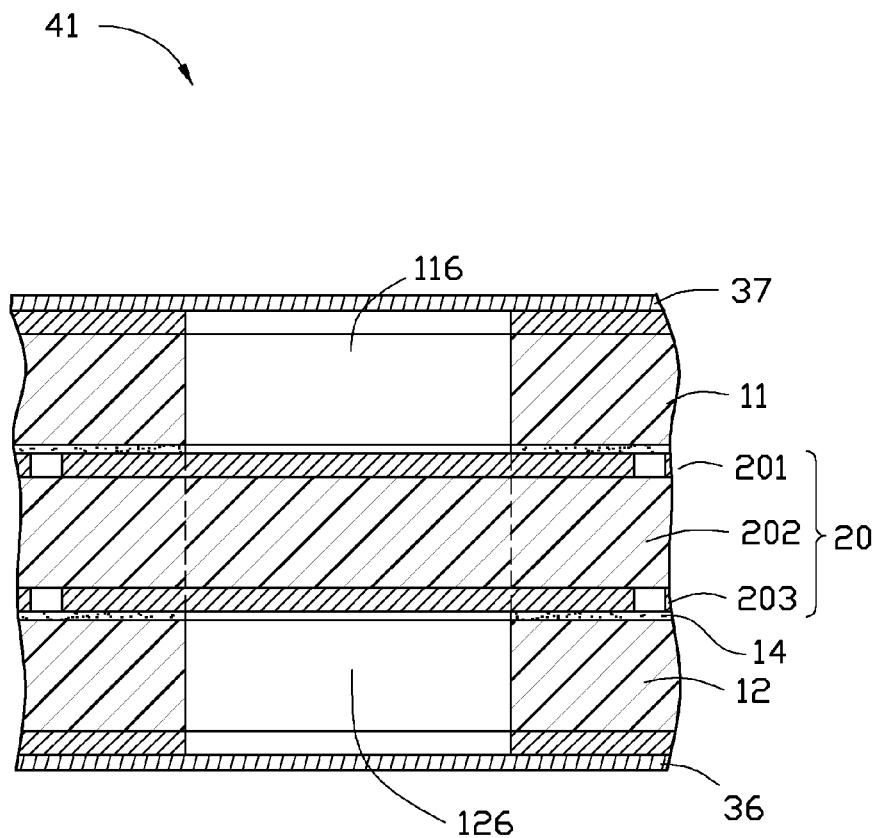
FIG. 12 is a cross-sectional view of another stacked substrate, which is obtained by stacking a third release film, the second rigid substrate of FIG. 11, the laminated substrate of FIG. 7 and a fourth release film together.
Figure 13:
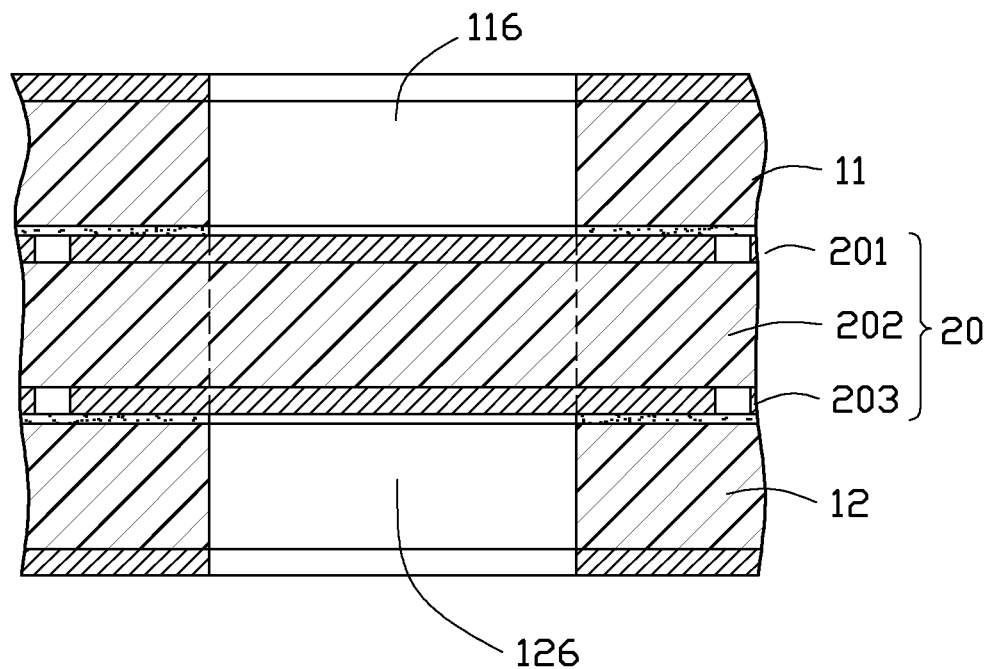
FIG. 13 is a cross-sectional view of another laminated substrate, which is obtained by laminating the second rigid substrate of FIG. 11 onto the laminated substrate of FIG. 7.

Referring to FIG. 12 and FIG. 13, in step (6), the second rigid substrate 12 is laminated to the other side of the flexible substrate 20 of FIG. 7 in such a manner that the flexible substrate 20 is sandwiched between the first and second adhesive layers 13 and 14, the second laminating portion 204 is sandwiched between the first and the third laminating portions 114 and 124, the exposed portion 205 is exposed in the first and the second openings 116 and 126.

Laminating the second rigid substrate 12 to the flexible substrate 20 includes following steps. First, the second rigid substrate 12 is attached to the third electrically conductive layer 203 of the flexible substrate 20 using a roller compacting process. Second, a third release film 36 and a fourth release film 37 are provided. The third release film 36, the second rigid substrate 12, the second adhesive layer 14, the flexible substrate 20, the first adhesive layer 13, the first rigid substrate 11, and the fourth release film 37 are stacked one on another in that order, thus a second stacked substrate 41 shown in FIG. 12 is obtained. Third, the second stacked substrate 41 is sent to a rapid pressing mechanism and is compressed. The pressing process includes a initially-pressing stage and a main-pressing stage succeeding to the initially-pressing stage. The pressure applied on the second stacked substrate 41 in the main-pressing stage is larger than that in the initially-pressing stage, and a time period of the main-pressing stage is longer than that of the initially-pressing stage. The purpose of the initially-pressing stage is to remove the gas between the adjacent layers of the second stacked substrate 41. In the initially-pressing stage which lasts 30 seconds, the temperature of the second stacked substrate 41 is 90° C., and the pressure applied on the second stacked substrate 41 is 10 kilograms per square centimeter (kg/cm2). The second adhesive layer 14 intenerates and the material of the second adhesive layer 14 flows, thus the gas between the adjacent layers of the second stacked substrate 41 is removed. Then the main-pressing stage comes. The purpose of the main-pressing stage is to make the material of the second adhesive layer 14 uniformly distributed between the second rigid substrate 12 and the flexible substrate 20. In the main-pressing stage which lasts 150 seconds, the temperature of the first stacked substrate 40 is kept at 90° C., and the pressure applied on the first stacked substrate 40 is increased to 30 kg/cm2. After the main-pressing stage, the material of the second adhesive layer 14 is not fully cured. Fourth, the second stacked substrate 41 is dried to be completely cured. The second stacked substrate is dried under a temperature in a range from about 90° C. to about 150° C., and the process lasts about 60 minutes to 180 minutes.

The second rigid substrate 12 is laminated to the third electrically conductive layer 203 of the flexible substrate 20, and a laminated substrate 101 is obtained. The second laminating portions 204 are adhered to the third laminating portions 124 by the second adhesive layer 14. The second adhesive layer 14 is in contact with the third electrically conductive layer 203 of the flexible substrate 20. The exposed portion 205 is exposed to outside through the second opening 126.

Figure 14:
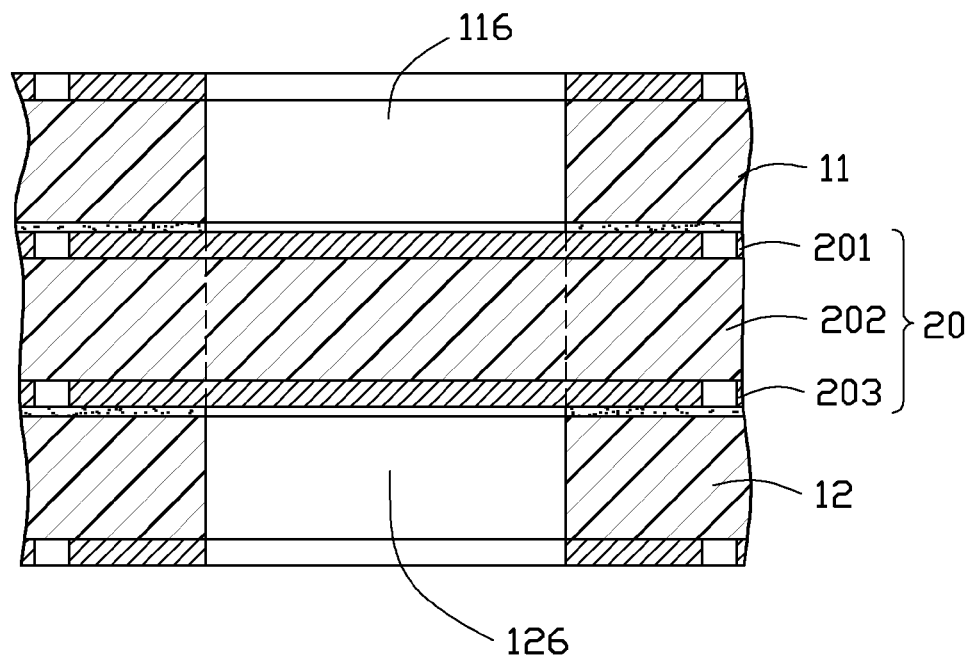
FIG. 14 is similar to FIG. 13, but showing the first rigid substrate and the second rigid substrate are patterned.

Referring to FIG. 14, after the laminated substrate 101 is obtained, the first and fourth electrically conductive layer 110, 120 are patterned. Furthermore, a plurality of plated through holes (not shown) can be formed in the first and second rigid substrate 11, 12 of the laminated substrate 101 to electrically interconnect the first and second electrically conductive layer 110 and 201, the fourth and third electrically conductive layer 120 and 203. In addition, a cover layer (not shown) can be formed on the laminated substrate 101 to protect the conductive patterns formed by the third electrically conductive layers 201 and the third electrically conductive layer 203.

Figure 15:
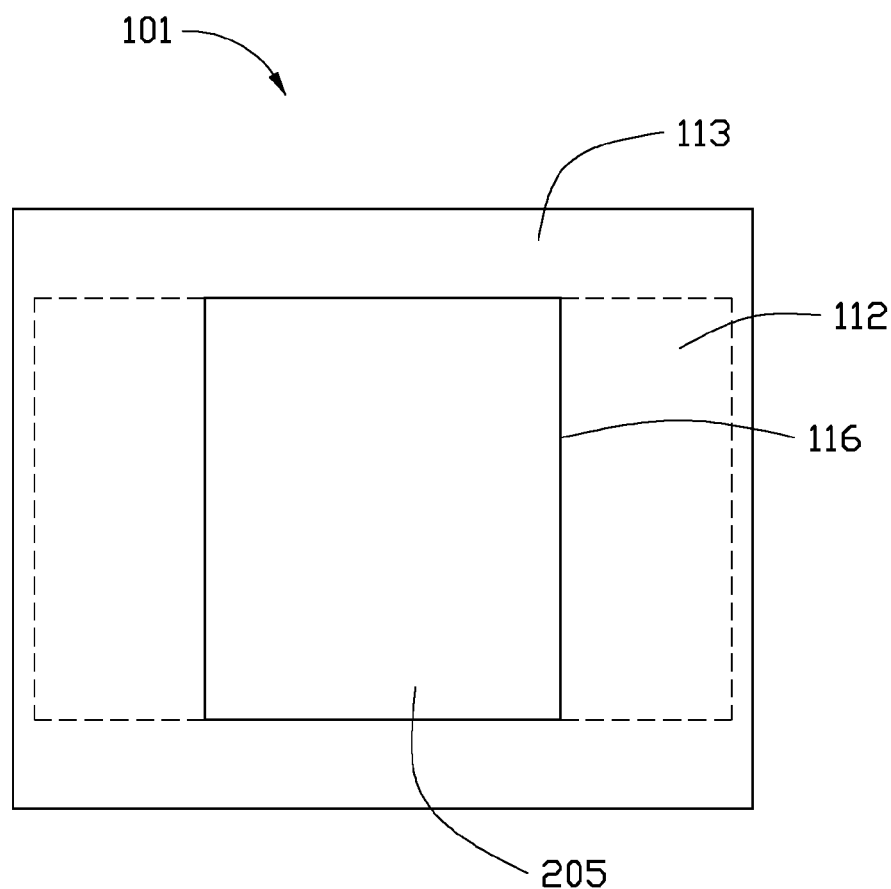
FIG. 15 is a top plan view of the laminated substrate in FIG. 14.
Figure 16:
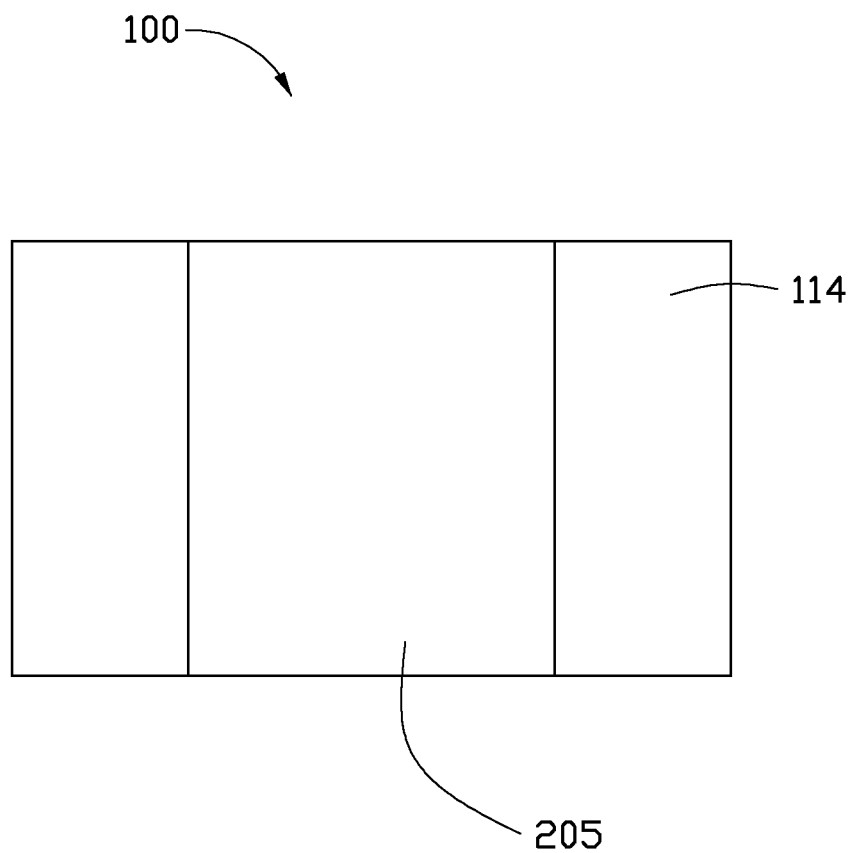
FIG. 16 is a top plan view of a rigid-flexible printed circuit board, which is obtained by cutting the laminated substrate along an imaginary boundary line shown in FIG. 15.

Referring to FIG. 15 and FIG. 16, the first and second peripheral margin portion 113 and 123, and a portion of the flexible substrate 20 overlaid by the first peripheral margin portion 113 are removed, and a rigid-flexible printed circuit board 100 is obtained. The laminated substrate 101 is cut along the imaginary boundary lines between the first main portion 112 and the first peripheral margin portion 113. The imaginary boundary lines between the first main portion 112 and the first peripheral margin portion 113 corresponding to the borderlines between the second main portion 122 and the second peripheral margin portion 123 of the second rigid substrate 12.

The rigid-flexible printed circuit board 100 has two rigid regions (not shown) each formed from the combined first, second and third laminating portions 114, 204 and 124, and one flexible region (not shown) formed from the exposed portion 205 of the flexible substrate 20.

In the present embodiment, during the pressing process of Laminating the first rigid substrate 11 to the flexible substrate 20, no pleat is formed in the flexible substrate 20 supported by the first and second bolster plates 31, 35, and the first adhesive layer 13 is fully cured. Thus, during the pressing process of laminating the second rigid substrate 12 to the flexible substrate 20, no deformation is formed in the first adhesive layer 13 or the flexible substrate 20, and the appearance and quality of the rigid-flexible printed circuit board 100 is improved.

While certain embodiments have been described and exemplified above, various other embodiments will be apparent to those skilled in the art from the foregoing disclosure. The present disclosure is not limited to the particular embodiments described and exemplified but is capable of considerable variation and modification without departure from the scope of the appended claims.

What is claimed is:

1. A method for manufacturing a rigid-flexible printed circuit board, comprising:
    attaching a first rigid substrate to a first adhesive layer, the first rigid substrate comprising a first laminating portion and a first unwanted portion;
    removing the first unwanted portion and a portion of the first adhesive layer overlaid by the first unwanted portion, thereby defining a first opening through the combined first rigid substrate and the first adhesive layer;
    laminating the first rigid substrate to a flexible substrate after removing the first unwanted portion and a portion of the first adhesive layer overlaid by the first unwanted portion, the flexible substrate comprising an exposed portion exposed via the first opening and a second laminating portion overlaid by the first laminating portion;
    attaching a second rigid substrate to a second adhesive layer, the second rigid substrate comprising a third laminating portion and a second unwanted portion, a glass transition temperature of the second adhesive layer being lower than that of the first adhesive layer;
    removing the second unwanted portion and a portion of the second adhesive layer overlaid by the second unwanted portion, thereby defining a second opening through the combined second rigid substrate and the second adhesive layer; and
    laminating the second rigid substrate to the flexible substrate in such a manner that the flexible substrate is sandwiched between the first and second adhesive layers, the second laminating portion is sandwiched between the first and the third laminating portions, the first and second openings are aligned with each other, the exposed portion is exposed in the first and the second openings after removing the second unwanted portion and a portion of the second adhesive layer overlaid by the second unwanted portion and after laminating the first rigid substrate to a flexible substrate, obtaining the rigid-flexible printed circuit board, the first, second and third laminating portions cooperatively serving as a rigid region of the rigid-flexible printed circuit board, the exposed portion serving as a flexible region of the rigid-flexible printed circuit board wherein the step of compressing of the first stacked substrate includes an initially-pressing stage, a main-pressing stage succeeding to the initially-pressing stage, and a cold-pressing stage succeeding to the main-pressing stage, the pressure applied on the first stacked substrate in the main-pressing stage is larger than that in the initially-pressing stage, and a time period of the main-pressing stage is longer than that of the initially-pressing stage, the pressure applied on the first stacked substrate in the main-pressing stage is larger than that in the cold-pressing stage, and the time period of the main-pressing stage is longer than that of the cold-pressing stage.

2. The method of claim 1, wherein the glass transition temperature difference between the first and second adhesive layer is larger than 50 degrees Celsius.

3. The method of claim 1, wherein the first adhesive layer has a glass transition temperature in a range from 120 degrees Celsius to 130 degrees Celsius, the second adhesive layer has a glass transition temperature in a range from 70 degrees Celsius to 80 degrees Celsius.

4. The method of claim 1, wherein the first laminating portion and the first unwanted portion cooperatively constitute a first main portion, the first rigid substrate further includes a first peripheral margin portion connected to the first main portion, the third laminating portion and the second unwanted portion cooperatively constitute a second main portion, the second rigid substrate further includes a second peripheral margin portion connected to the second main portion, after laminating the second rigid substrate to the flexible substrate, the first and second peripheral margin portions are removed.

5. The method of claim 1, wherein the step of laminating the first rigid substrate to the flexible substrate comprising:
    attaching the first rigid substrate to the flexible substrate using a roller compacting process;
    providing a first bolster plate, a second bolster plate, a first release film, a second release film, and a silicon rubber sheet, and stacking the first bolster plate, the first release film, the flexible substrate, the first adhesive layer, the first rigid substrate, the second release film, the silicon rubber sheet and the second bolster plate one on another in that order, thus obtaining a first stacked substrate; and
    compressing the first stacked substrate.

6. The method of claim 1, wherein laminating the second rigid substrate to the flexible substrate comprising:
    attaching the second rigid substrate to the flexible substrate;
    providing a third and a fourth release film, the third release film, and stacking the second rigid substrate, the second adhesive layer, the flexible substrate, the first adhesive layer, the first rigid substrate, and the fourth release film one on another in the said order, thus obtaining a second stacked substrate;
    compressing the second stacked substrate; and
    drying the compressed second stacked substrate.

7. The method of claim 6, wherein the step of compressing the second stacked substrate includes an initially-pressing stage and a main-pressing stage succeeding to the initially-pressing stage, the pressure applied on the second stacked substrate in the main-pressing stage is larger than that in the initially-pressing stage, and the time period of the main-pressing stage is longer than that of the initially-pressing stage.

8. The method of claim 6, wherein the second stacked substrate is dried at a temperate in a range from 90 degrees Celsius to 150 degrees Celsius, for a time period in a range from 60 minutes to 180 minutes.

9. The method of claim 5, wherein the first rigid substrate includes a first electrically conductive layer, the second rigid substrate includes a fourth electrically conductive layer, after laminating the second rigid substrate to the flexible substrate, the first and fourth electrically conductive layer are arranged at the outermost sides of the rigid-flexible printed circuit board, after laminating the second rigid substrate to the flexible substrate, the first and fourth electrically conductive layer are patterned.

10. A method for manufacturing a rigid-flexible printed circuit board, comprising:

providing a first rigid copper clad laminate and a first adhesive layer;

attaching the first adhesive layer to the first rigid copper clad laminate thereby obtaining a first rigid substrate, which comprises a first laminating portion and a first unwanted portion;

removing the first unwanted portion of the first rigid substrate thereby defining a first opening therein;

providing a flexible substrate, the flexible substrate including an exposed portion corresponding to the first opening and a second laminating portion corresponding to the first laminating portion;

laminating the first rigid substrate to the flexible substrate in such a manner that the second laminating portion is overlaid by the first laminating portion and the exposed portion is exposed in the first opening after removing the first unwanted portion of the first rigid substrate;

providing a second rigid copper clad laminate and a second adhesive layer, a glass transition temperature of the second adhesive layer being lower than that of the first adhesive layer;

attaching the second adhesive layer to the second rigid copper clad laminate thereby obtaining a second rigid substrate, which comprises a third laminating portion and a second unwanted portion;

removing the second unwanted portion of the second rigid substrate thereby defining a second opening;

laminating the second rigid substrate to the flexible substrate in such a manner that the flexible substrate is sandwiched between the first and the second adhesive layers, the second laminating portion is laminated sandwiched between the first and the third laminating portions, the first and second openings are aligned with each other, the exposed portion is exposed in the first and the second openings after laminating the first rigid substrate to the flexible substrate, obtaining the rigid-flexible printed circuit board, the first, second and third laminating portions cooperatively serving as a rigid region of the rigid-flexible printed circuit board, the exposed portion serving as a flexible region of the rigid-flexible printed circuit board wherein the step of compressing of the first stacked substrate includes an initially-pressing stage, a main-pressing stage succeeding to the initially-pressing stage, and a cold-pressing stage succeeding to the main-pressing stage, the pressure applied on the first stacked substrate in the main-pressing stage is larger than that in the initially-pressing stage, and a time period of the main-pressing stage is longer than that of the initially-pressing stage, the pressure applied on the first stacked substrate in the main-pressing stage is larger than that in the cold-pressing stage, and the time period of the main-pressing stage is longer than that of the cold-pressing stage.

11. The method of claim 10, wherein the glass transition temperature difference between the first and second adhesive layer is larger than 50 degrees Celsius.

12. The method of claim 10, wherein the first adhesive layer has a glass transition temperature in a range from 120 degrees Celsius to 130 degrees Celsius, the second adhesive layer has a glass transition temperature in a range from 70 degrees Celsius to 80 degrees Celsius.

13. The method of claim 10, wherein the first laminating portion and the first unwanted portion cooperatively constitute a first main portion, the first rigid substrate further includes a first peripheral margin portion connected to the first main portion, the third laminating portion and the second unwanted portion cooperatively constitute a second main portion, the second rigid substrate further includes a second peripheral margin portion connected to the second main portion, after laminating the second rigid substrate to the flexible substrate, the first and second peripheral margin portions are removed.

14. The method of claim 10, wherein the step of laminating the first rigid substrate to the flexible substrate comprising:

attaching the first rigid substrate to the second electrically conductive layer of the flexible substrate using a roller compacting process;

providing a first bolster plate, a second bolster plate, a first release film, a second release film, and a silicon rubber sheet, and stacking the first bolster plate, the first release film, the flexible substrate, the first adhesive layer, the first rigid substrate, the second release film, the silicon rubber sheet and the second bolster plate one on another in that order, thus obtaining a first stacked substrate; and compressing the first stacked substrate.

15. The method of claim 10, wherein laminating the second rigid substrate to the flexible substrate comprising:

attaching the second rigid substrate to the flexible substrate;

providing a third and a fourth release films, the third release film, and stacking the second rigid substrate, the second adhesive layer, the flexible substrate, the first adhesive layer, the first rigid substrate, and the fourth release film one on another in the said order, thus obtaining a second stacked substrate;

compressing the second stacked substrate; and drying the compressed second stacked substrate.

16. The method of claim 15, wherein the step of compressing the second stacked substrate includes an initially-pressing stage and a main-pressing stage succeeding to the initially-pressing stage, the pressure applied on the second stacked substrate in the main-pressing stage is larger than that in the initially-pressing stage, and the time period of the main-pressing stage is longer than that of the initially-pressing stage.

17. The method of claim 15, wherein the second stacked substrate is dried at a temperate in a range from 90 degrees Celsius to 150 degrees Celsius, and for a time period in a range from 60 minutes to 180 minutes.

18. The method of claim 14, wherein the first rigid copper clad laminate includes a first electrically conductive layer, the second rigid copper clad laminate includes a fourth electrically conductive layer, after laminating the second rigid substrate to the flexible substrate, the first and fourth electrically conductive layer are arranged at the outermost sides of the rigid-flexible printed circuit board, after laminating the second rigid substrate to the flexible substrate, the first and fourth electrically conductive layer are patterned.

* * * * *